United States Patent
Chen et al.

(10) Patent No.: US 8,563,391 B2
(45) Date of Patent: Oct. 22, 2013

(54) METHOD FOR FORMING MIM CAPACITOR IN A COPPER DAMASCENE INTERCONNECT

(75) Inventors: Chun-Hong Chen, Hsinchu County (TW); Minghsing Tsai, Chu-Pei (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 12/316,956

(22) Filed: Dec. 17, 2008

(65) Prior Publication Data

US 2009/0111234 A1 Apr. 30, 2009

Related U.S. Application Data

(62) Division of application No. 11/300,567, filed on Dec. 13, 2005, now Pat. No. 7,483,258.

(51) Int. Cl.
*H01L 21/20* (2006.01)

(52) U.S. Cl.
USPC .................. 438/396; 438/387; 257/E21.008

(58) Field of Classification Search
USPC ......... 438/392, 396, 386, 387, 244, 253, 239; 257/532, 301, 303, 306, E21.008
See application file for complete search history.

(56) References Cited

U.S. PATENT DOCUMENTS

| | | | |
|---|---|---|---|
| 6,222,219 B1 | 4/2001 | Gambino et al. | |
| 6,329,234 B1 | 12/2001 | Ma et al. | |
| 6,461,914 B1 * | 10/2002 | Roberts et al. | 438/253 |
| 6,680,521 B1 * | 1/2004 | Kar-Roy et al. | 257/532 |
| 6,709,918 B1 | 3/2004 | Ng et al. | |
| 6,720,608 B2 | 4/2004 | Lee | |
| 6,730,573 B1 * | 5/2004 | Ng et al. | 438/381 |
| 6,746,914 B2 | 6/2004 | Kai et al. | |
| 6,750,113 B2 | 6/2004 | Armacost et al. | |
| 6,759,703 B1 * | 7/2004 | Matsuhashi | 257/306 |
| 6,764,915 B2 * | 7/2004 | Lee | 438/396 |
| 6,829,135 B2 | 12/2004 | Honda et al. | |
| 6,903,918 B1 | 6/2005 | Brennan | |
| 7,051,934 B2 | 5/2006 | Lee et al. | |
| 7,189,615 B2 * | 3/2007 | Rao et al. | 438/250 |
| 7,332,764 B2 | 2/2008 | Choi et al. | |
| 2004/0224474 A1 * | 11/2004 | Barth et al. | 438/396 |
| 2005/0062130 A1 * | 3/2005 | Ciancio et al. | 257/532 |
| 2005/0112836 A1 * | 5/2005 | Kim et al. | 438/307 |
| 2005/0167722 A1 * | 8/2005 | Won | 257/303 |
| 2007/0132061 A1 | 6/2007 | Chen et al. | |

FOREIGN PATENT DOCUMENTS

JP    2001203329    *  7/2001

* cited by examiner

*Primary Examiner* — Chuong A Luu
*Assistant Examiner* — Nga Doan
(74) *Attorney, Agent, or Firm* — Duane Morris LLP

(57) ABSTRACT

A method for forming a metal-insulator-metal capacitor in a multilevel semiconductor device utilizes the copper interconnect levels of the semiconductor device as parts of the capacitor. A lower capacitor plate consists of a copper interconnect level and a first metal layer formed on the copper interconnect level by selective deposition methods. The upper capacitor plate includes the same pattern as the capacitor dielectric, the pattern having an area less than the area of the lower capacitor plate. The upper capacitor plate is formed of a second metal layer. The first and second metal layers may each be formed of cobalt, tungsten, nickel, molybdenum, or a combinations of one of the aforementioned elements with boron and/or phosphorus. Conductive vias provide contact from the upper capacitor plate and lower capacitor plate, to interconnect levels.

13 Claims, 2 Drawing Sheets

METHOD FOR FORMING MIM CAPACITOR IN A COPPER DAMASCENE INTERCONNECT

RELATED APPLICATION

This application is a divisional application of U.S. patent application Ser. No. 11/300,567, filed on Dec. 13, 2005, now U.S. Pat. No. 7,483,258 the contents of which are hereby incorporated by reference as if set forth in their entirety.

BACKGROUND

The present invention relates generally to integrated circuits, and more particularly to a structure having a metal-insulator-metal capacitor in a copper damascene interconnect.

Transistors are used as the predominant switching element in both analog and digital integrated circuits (ICs). To make functional circuits, passive components such as resistors and capacitors are also required. Metal-insulator-metal (MIM) capacitors are very desirable components because they exhibit low resistance, especially with copper, low inductance, and no voltage shift.

Copper is favored for its low electric resistance. By utilizing the technique of chemical-mechanical-polishing (CMP), which is the standard means to efficiently planarize dielectric and copper surfaces in multi-level metallization schemes for ICs, dual copper damascene structures can be created. These structures can be further utilized to build a stack of intricate metallization interconnection layers.

For efficient, minimal size circuitry, it is desirable to place MIM capacitors within such a stack of intricate metallization interconnection layers. However, a capacitor has its own quality construction requirements. To form a capacitor, the dielectric between the two metal plates must not be electrically leaky. Uniformity and continuity considerations require that the dielectric interfaces with the metal plates have predictable parameters. The interfaces should be flat and clean, with good adhesion between adjacent materials. Such properties are generally difficult to achieve between a dielectric and a bare copper surface.

Also, the construction of conventional MIM capacitors typically requires two additional, costly, photomasks. Aligning them also typically requires costly space, since their usual locations are typically between existing metal patterns and even between existing metal levels.

Therefore, desirable in the art of integrated circuit designs are additional designs and structures that allow the construction of MIM capacitors without inheriting the aforesaid costly factors.

SUMMARY

In view of the foregoing, the following provides a structure having a metal-insulator-metal capacitor in a multilevel copper semiconductor device utilizing damascene interconnect technology. The formation of MIM capacitors is integrated into a copper CMP multi-level metallization process and includes the selective deposition of a metal film or alloy on a bottom capacitor plate.

In one embodiment, a method for forming a metal-insulator-metal capacitor is provided. The method provides forming a capping layer by selectively depositing a metal layer on a bottom capacitor plate, forming a capacitor dielectric overlying the capping layer, and forming a top capacitor plate overlying the capacitor dielectric.

In another embodiment, a method for forming a metal-insulator-metal capacitor within a multilevel copper semiconductor device comprises depositing a first metal layer on a copper level, the first metal layer comprising at least one of cobalt, tungsten, nickel and molybdenum, forming a first dielectric having a first pattern on the first metal layer, disposing a second metal layer having the first pattern on the first dielectric, forming an interlevel dielectric over the second metal layer and the first metal layer, and forming at least one via opening extending to the second metal layer through the interlevel dielectric.

The construction and method of operation of the invention, however, together with additional objects and advantages thereof will be best understood from the following description of specific embodiments when read in connection with the accompanying drawings.

DESCRIPTION

The following invention discloses a structure having a metal-insulator-metal capacitor in a semiconductor device that includes multilevel copper damascene interconnect technology.

Figure 1:
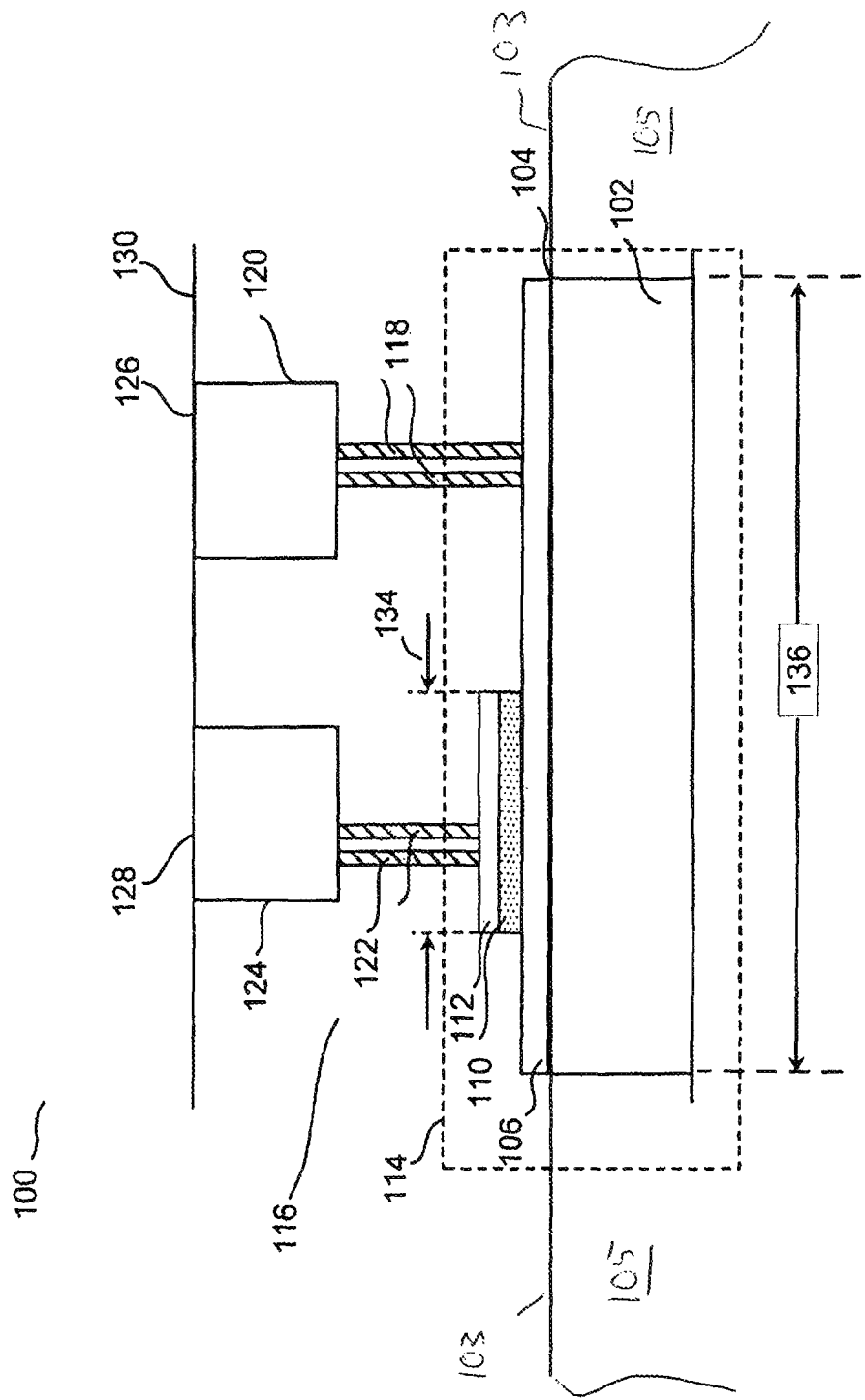
FIG. 1 presents a structure in accordance with one embodiment of the present invention.

In FIG. 1, a cross section 100 illustrates the structure of a metal-insulator-metal (MIM) capacitor that is constructed within the multi-level metallization of an integrated circuit (IC). A discrete portion of a patterned metal level forms part of the bottom plate 102 of a capacitor. As an example, the patterned metal level that forms bottom plate 102 may be composed of copper that is utilized in several other aspects of the semiconductor device. Further as an example, this metal level may be the seventh metal layer in a multi-level metallization scheme and which is therefore utilized in several other aspects of the semiconductor device. In other exemplary embodiments, the metal level from which bottom plate 102 is formed, may represent a different metal levels of a multilevel metallization scheme. An advantage of the invention is the vertical integration of the MIM capacitor above underlying metal layers.

Bottom plate 102 may be constructed in a process involving chemical-mechanical-polishing (CMP) in which top surface 104 is co-planar with the upper surface 103 of the dielectric 105 in which the copper is formed. A top surface 104 of bottom plate 102 has been polished in the course of CMP. It may be left with some pits and gouges from polishing. If left untreated and unprotected, the top surface 104 will grow hillocks and will undesirably oxidize unpredictably and unevenly, with uneven oxide density. Therefore, as soon as is practical after CMP and cleanup, a metal cap 106 is deposited on the top surface 104 of bottom plate 102. The material of the metal cap 106 may be cobalt (Co), tungsten (W), nickel (Ni) or molybdenum (Mo), combinations thereof, or any of the aforementioned materials in combination with elements such as boron (B) or phosphorus (P). The materials of metal cap 106 such as the aforementioned examples, are chosen to adhere to the top surface 104 better than a typical dielectric may. Metal cap 106 may be formed by the selective deposition of the metal cap material on exposed surfaces of copper. Known deposition techniques may be used to carry out the selective deposition. Metal cap 106 serves to protect the top surface 104 during processing and also provides improved flatness and uniformity of the capacitor. Now, a broader selection of dielectrics is available that will adhere better to the metal cap 106 than to a bare surface such as copper.

The deposition of a dielectric 110 can be a selective deposition, wherein only certain prepared areas accept the deposition, or only certain areas are exposed to accept the deposition through one or more photoresist windows. More typically, a blanket dielectric is deposited then patterned by etching, commonly after further processing. Further processing may include the deposition of a metal top plate 112 on the dielectric 110. The material of metal top plate 112 may be cobalt (Co), tungsten (W), nickel (Ni) or molybdenum (Mo), combinations thereof, or any of the aforementioned materials in combination with one or more elements such as boron (B) and phosphorus (P). In other embodiments, other suitable conductive material such as TaN, TiN, or Al may be used. These materials are chosen because they adhere to the dielectric 110 better than does copper. Now, most typically, a single extra photomask is required for the pattern etching of the metal top plate 112. Then, the etching continues using metal top plate 112 as a mask, to etch the dielectric 110. Conventional etching methods are used.

The result is the formation of a capacitor 114 that is composed of the metal top plate 112, the dielectric 110 having the same pattern as the metal top plate 112, and the bottom plate 102 with metal cap 106. Bottom plate 102 has width 136 and has a greater area than top plate 112 having width 134, for example, in the embodiment in which each of the plates are square in the plan view, or include the same depth (perpendicular to the plane of the drawing).

The process continues with the deposition of an interlevel dielectric 116. The capacitor 114 is now buried and inaccessible. In order to gain access and make electrical contact to the bottom plate 102 of the capacitor 114, vias 118 and discrete trench 120 are etched down through the interlevel dielectric 116 to metal cap 106. Further, to gain access and make electrical contact to the metal top plate 112 of the capacitor 114, vias 122 and a discrete trench 124 are etched down through the interlevel dielectric 116 to the metal top plate 112. Within the vias and trenches, typically, a barrier metal may optionally be deposited first. Then, copper is deposited as the bulk metal. This metal structure is the eighth metal level according to the embodiment wherein the metal level from which bottom plate 102 is formed, is the seventh metal level and may be also used for other device features. CMP may be used to produce a discrete copper electrode 126 that makes electrical contact to the bottom plate 102 of the capacitor 114 through metal cap 106. The CMP process also produces a discrete copper electrode 128 which makes electrical contact to the metal top plate 112 of the capacitor 114. In the CMP process, the surface of the interlevel dielectric 114 and any overcoating metal are polished to produce a flat surface 130.

The interface between the metal cap 106 and the dielectric 110 is of higher quality than an interface between bottom plate 102 and the dielectric 110. The interface between the metal top plate 112 and the dielectric 110 is also of high quality because of the absence of copper. Each of the surfaces are flatter and free of copper oxide thus reducing electrical leakage in the capacitor.

Figure 2:
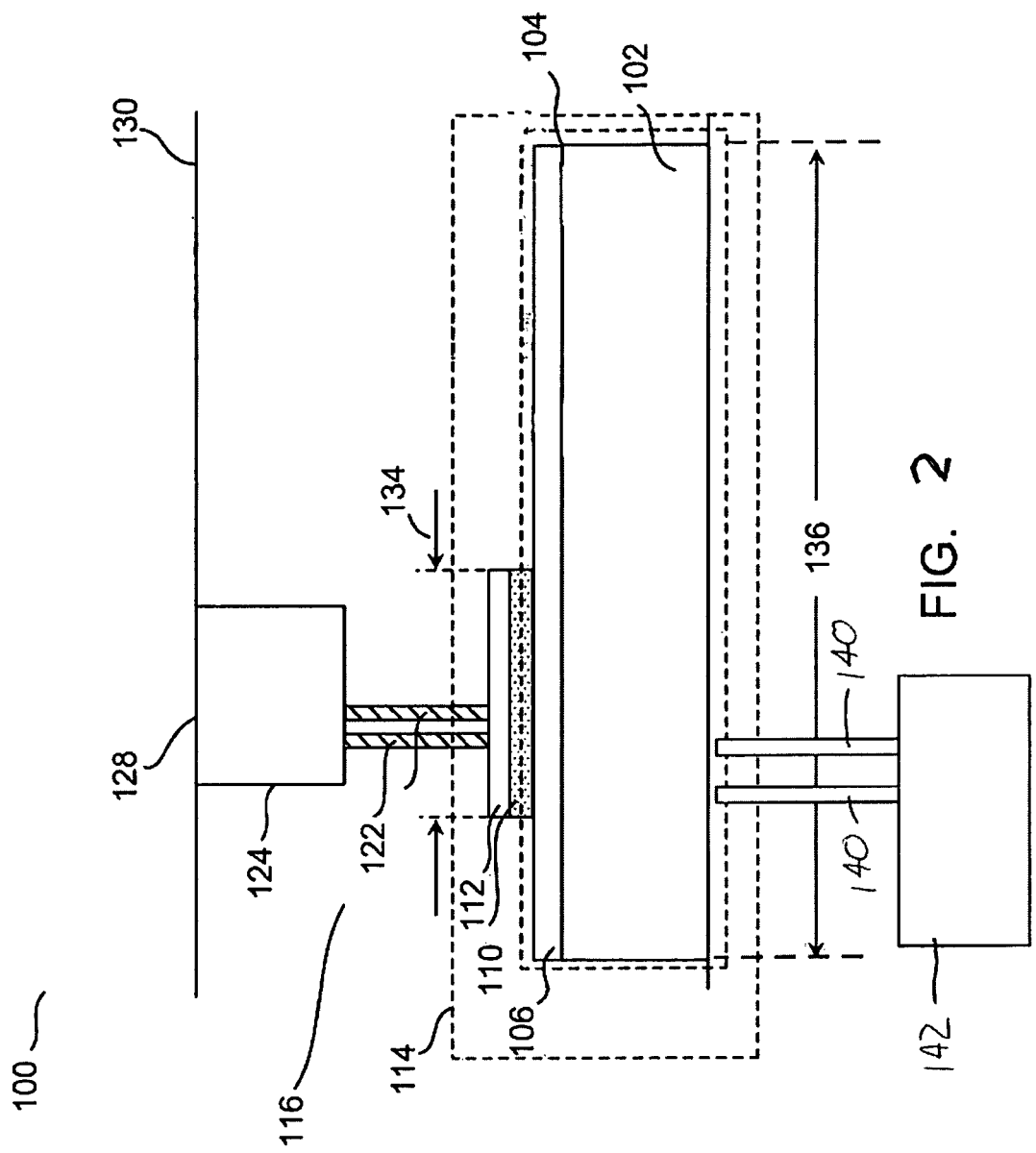
FIG. 2 presents a structure in accordance with another embodiment of the present invention.

FIG. 2 shows another exemplary embodiment. According to the illustrated embodiment, bottom plate 102 of capacitor 114 is coupled through vias 140 to metal layer 142 which is disposed, in part, beneath the MIM capacitor. More particularly, contact to bottom plate 102 is made by metal layer 142 which is laterally connected to other structures (not shown). Metal layer 142 may be formed using conventional methods and of various suitable conductive materials. In one exemplary embodiment, metal layer 142 may be the sixth metal layer, making bottom plate 102 formed from the seventh metal layer.

An aspect of the invention is the formation of a metal-insulator-metal (MIM) capacitor integrated into a current copper CMP multi-level metallization scheme. Only one extra photomask is required to integrate the MIM capacitor, thereby reducing production complexity and cost.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for forming a metal-insulator-metal capacitor, comprising:
   forming a capping layer using a selective deposition operation that selectively deposits a metal cap material on a surface of a structure, wherein the surface includes a bottom capacitor plate portion and a dielectric portion, and wherein the selective deposition deposits the metal cap material directly on the bottom capacitor plate portion but not on the dielectric portion of the surface;
   forming a capacitor dielectric overlying the capping layer by depositing said capacitor dielectric overlying the capping layer only in exposed areas through windows in a photoresist material; and
   forming a top capacitor plate overlying the capacitor dielectric,
   wherein the metal cap material is a single material layer.

2. The method as in claim 1, further comprising:
   forming an interlevel dielectric over the top capacitor plate and the capping layer; and
   forming at least one via opening extending to the top capacitor plate through the interlevel dielectric, and at least one further via opening extending to the capping layer.

3. The method as in claim 2, wherein the forming at least one via opening includes forming a trench in the interlevel dielectric and forming the at least one via opening to extend from the trench to the top capacitor plate and the forming at least one further via opening includes forming a further trench in the interlevel dielectric and forming the at least one further via opening to extend from the further trench to the capping layer.

4. The method as in claim 1, wherein the capping layer comprises a first metal layer and the bottom capacitor plate comprises a copper level, the first metal layer comprising at least one of cobalt, tungsten, nickel and molybdenum or at least one of cobalt, tungsten, nickel and molybdenum in combination with at least one of boron and phosphorus; the capacitor dielectric includes a first pattern; and the top capacitor plate is a second metal layer having the first pattern.

5. A method for forming a metal-insulator-metal capacitor within a multilevel copper semiconductor device, the method comprising:

based on a structure with a surface including a copper level surface portion of a copper level, and a lower dielectric surface portion of a lower dielectric, selectively depositing a first metal layer on the copper level surface portion using a selective deposition operation that deposits the first metal layer directly on the copper level surface portion but not on the lower dielectric surface portion, the first metal layer being a single material layer and comprising at least one of cobalt, tungsten, nickel and molybdenum;

forming a first dielectric having a first pattern on the first metal layer;

disposing a second metal layer having the first pattern on the first dielectric, the first metal layer and the copper level extending laterally past each of opposed ends of said first pattern;

forming an interlevel dielectric over the second metal layer and the first metal layer;

forming at least one via opening extending to the second metal layer through the interlevel dielectric; and forming at least one further via opening extending to the first metal layer.

6. The method as in claim 5, wherein the forming at least one via opening includes forming a trench in the interlevel dielectric and forming the at least one via opening to extend from the trench to the second metal layer, and the forming at least one further via opening includes forming a further trench in the interlevel dielectric and forming the at least one further via opening to extend from the further trench to the first metal layer.

7. The method as in claim 5, further comprising coupling the copper level to an underlying metal layer.

8. The method as in claim 5, wherein the copper level, the first metal layer, the first dielectric and the second metal layer form the metal-insulator-metal capacitor, with the first metal layer and the copper level comprising a bottom capacitor plate and the second metal layer comprising a top capacitor plate.

9. The method as in claim 5, wherein the forming a first dielectric and the disposing a second metal layer comprise depositing a film of the second metal layer over a film of the first dielectric, forming a pattern over the second metal layer then successively etching the second metal layer and the first dielectric to produce the first pattern on each of the first dielectric and the second metal layer.

10. The method as in claim 5, wherein the forming a first dielectric and the disposing a second metal layer includes etching the first dielectric using the second metal layer as a mask.

11. The method as in claim 5, wherein the second metal layer is formed of at least one of cobalt, tungsten, nickel and molybdenum or at least one of cobalt, tungsten, nickel, and molybdenum in combination with at least one of boron and phosphorus.

12. The method as in claim 5, further comprising forming a damascene opening in the lower dielectric, filling the opening with copper and polishing thereby producing the copper surface portion being substantially co-planar with the lower dielectric surface portion.

13. The method as in claim 5, wherein said forming a first dielectric comprises selectively depositing said first dielectric in exposed areas through windows in a photoresist material.

* * * * *